United States Patent [19]

Frechette

[11] Patent Number: 5,610,437
[45] Date of Patent: Mar. 11, 1997

[54] LEAD FRAME FOR INTEGRATED CIRCUITS

[75] Inventor: Raymond A. Frechette, North Providence, R.I.

[73] Assignee: Texas Instruments Incorporated, Dallas, Tex.

[21] Appl. No.: 249,109

[22] Filed: May 25, 1994

[51] Int. Cl.$^6$ .................................................. H01L 23/495
[52] U.S. Cl. ........................... 257/670; 257/666; 257/676
[58] Field of Search .................................... 257/666, 676, 257/670

[56] References Cited

U.S. PATENT DOCUMENTS

| | | |
|---|---|---|
| 4,868,635 | 9/1989 | Frechette et al. . |
| 5,196,268 | 3/1993 | Fritz . |
| 5,204,287 | 4/1993 | McLellan et al. . |
| 5,424,576 | 6/1995 | Djennas et al. ........................ 257/676 |

*Primary Examiner*—Mahshid Saadat
*Assistant Examiner*—S. V. Clark
*Attorney, Agent, or Firm*—W. Daniel Swayze, Jr.; W. James Brady, III; Richard L. Donaldson

[57] ABSTRACT

This invention relates to lead frames upon which chips are mounted prior to encapsulation. A lead frame structure (6) for manufacturing an IC device comprises a lead frame base (1) including a plurality of leads (10) and four first tie bar portions (16) extending toward a die pad aperture (17). A die pad (2) forms a mounting surface (20) for receiving a chip (30) and includes four second tie bar portions (21) extending from the mounting surface (20) and corresponding to the four first tie bar portions (16). The die pad (2) is affixed to the lead frame base (1) and positioned in the aperture (17) by affixing each of the second tie bar portions (21) to a corresponding one of the first tie bar portions (16).

12 Claims, 5 Drawing Sheets

LEAD FRAME FOR INTEGRATED CIRCUITS

FIELD OF THE INVENTION

This invention relates generally to packaging of integrated circuit (IC) devices and more particularly, to lead frames upon which chips are mounted and a method of manufacturing such lead frames.

BACKGROUND OF THE INVENTION

Most IC devices are assembled around a lead frame. These lead frames are commonly of various sizes dependent upon the size of the chip, e.g., the semiconductor chip, and the number of connections that are made to the chip. Such lead frames are usually manufactured in long strips of many individual units. The long strips often are wide enough to accommodate from one to more than five lead frames. When a lead frame strip is more than one lead frame wide, the strip is referred to as a matrix.

The evolution of IC devices generally has been toward smaller circuitry with greater packaging density. Packaging density refers to "high pin count" or "fine pitch" lead frames which have a large number of leads and currently are used in the most powerful IC devices. The desirability of such lead frames may be offset to some extent by the high tooling costs in creating stamped lead frames or establishing lead frame etching processes and the uncertain product life of new lead frame configurations.

Lead frames for a given IC device have their own shape, i.e., their own width and length, dependent upon the size of the chip. Particularly, the size of the chip dictates the size of the die or chip pad, which is an area of the lead frame upon which the chip is mounted. Further, the leads are spaced around and connected to the chip. Thus, adequate lead size and spacing is maintained, such that the leads may receive wire bonds connecting the leads to the chip's bond pads.

Because of the many sizes of die pads upon which a chip may be mounted, there are currently many different sizes and configurations of lead frames, such as quad or dual-in-line configurations. Each of these lead frames is manufactured separately by lead frame suppliers and IC device manufacturers. Complicated lead frame configurations may be made by expensive stamping tools and dies. Further, preparation of stamping equipment or etching processes for manufacturing such lead frames may result in increased lead frame costs and extended cycle time from demand through development to production. These costs and delays may be reincurred with each new lead frame design.

SUMMARY OF THE INVENTION

Accordingly, a need has arisen for a lead frame structure that can be readily and inexpensively modified to accept a plurality of different chips. A need has also arisen for a method by which the components of such versatile lead frame structures may be made and assembled economically at commercial rates. In accordance with the present invention, the lead frame structure includes a lead frame base having an outer lead frame and an inner lead frame and a die pad, such that when the lead frame base and the die pad are affixed to each other, the lead frame structure performs the functions of present lead frame designs.

An embodiment of the present invention is a lead frame structure for manufacturing an IC device. The lead frame structure comprises a lead frame base which includes a plurality of leads and a die pad aperture. The lead frame base may further comprise an outer and an inner lead frame. The lead frame base has at least one first tie bar portion which extends toward the aperture. A die pad forms a mounting surface for receiving at least one chip and includes at least one second tie bar portion. The at least one second tie bar portion extends from the mounting surface and corresponds to the at least one first tie bar portion. The die pad is affixed to the outer lead frame and positioned in the aperture by affixing the at least one second tie bar portion to corresponding at least one first tie bar portion.

Another embodiment of the invention is a method of manufacturing an IC device. The method comprises the step of forming a lead frame base. The lead frame base includes a plurality of leads and has a die pad aperture defined by the leads. The lead frame base also includes at least one first tie bar portion extending toward the aperture. The method also includes the step of forming a die pad having a mounting surface for receiving at least one chip and including at least one second tie bar portion extending from the mounting surface and corresponding to the at least one first tie bar portion. Further, the method includes affixing the at least one second tie bar portion to the corresponding at least one first tie bar portion and positioning the mounting surface in the aperture.

The present invention provides various technical advantages over known lead frames and lead frame manufacturing methods. A technical advantage of this invention is that the making the lead frame base and die pad separately allows the IC device manufacturer more design flexibility. For example, the materials used to make the die pad may be chosen with thermal expansion coefficients which are about equal to or more closely match those of the at least one chip or the plastic mold compound to reduce the likelihood of package damage caused by differing rates or degrees of expansion. Another technical advantage is that because of the design flexibility of this invention, the cycle time for marketing new IC devices may be shortened. Still another technical advantage is that the lead frame base and die pad may be produced using a generic etching process or stamp and then tailored or "customized" to accommodate a variety of chip bond pad configurations. Yet another technical advantage is that the lead frame bases may be readily adjusted by shortening the lead fingers to enlarge the die pad aperture to accommodate a variety of chip sizes.

Other technical advantages are readily apparent to one skilled in the art from the drawings, descriptions, and claims.

BRIEF DESCRIPTION OF THE DRAWINGS

For a more complete understanding of the present invention and the technical advantages thereof, reference is made to the following description taken in conjunction with accompanying drawings in which.

DETAILED DESCRIPTION OF THE INVENTION

Figure 1:
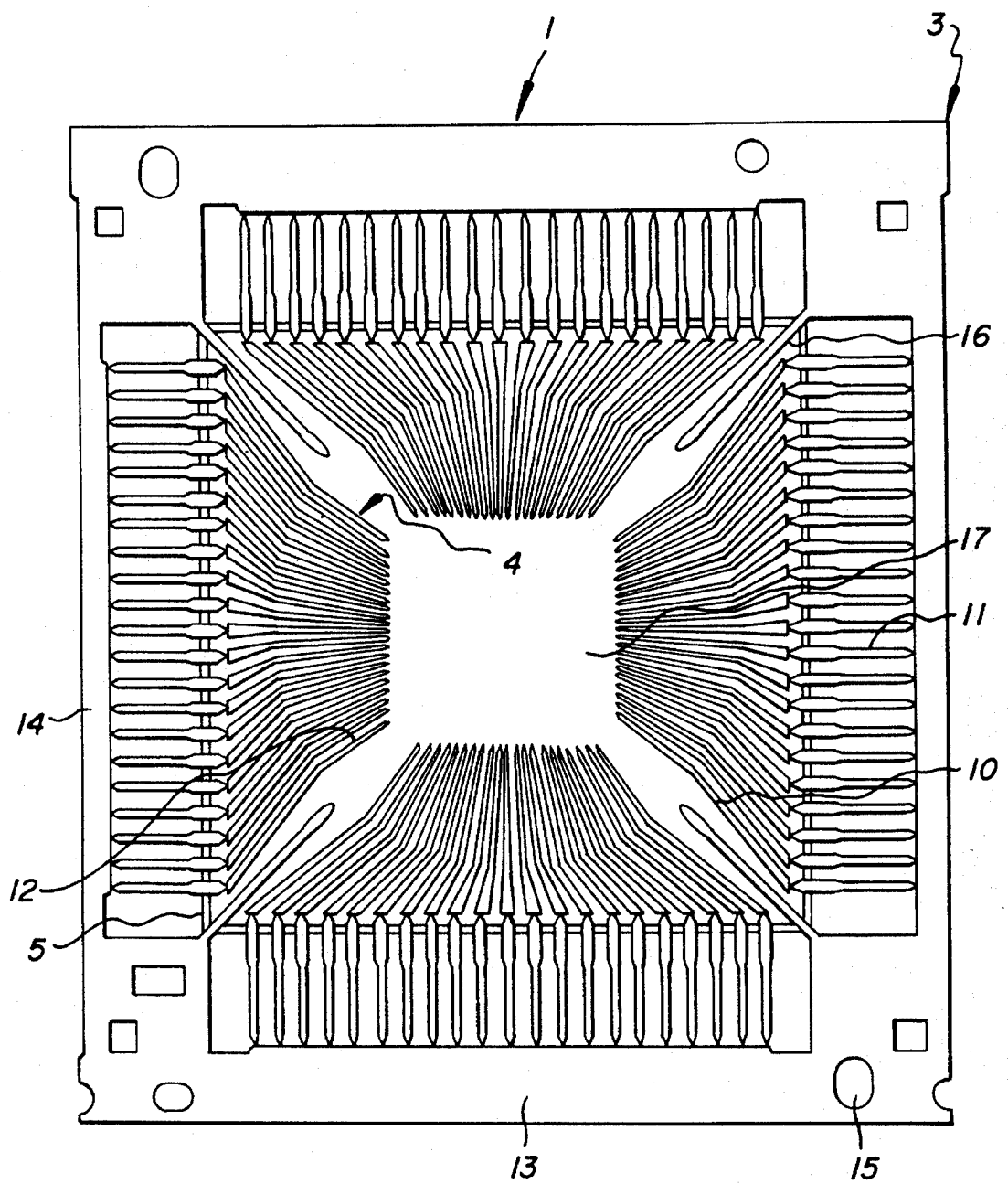
FIG. 1 depicts an overhead view of a lead frame base with attached carrier rails.

Referring to FIG. 1, an overhead view of a lead frame base 1 with attached carrier rails 13 is depicted. Lead frame base 1 comprises an outer lead frame 3 separated from an inner lead frame 4 by a dam bar 5. Lead frame base 1 includes a plurality of leads 10, each having lead ends 11 and lead fingers 12, and four first tie bar portions 16 which extend from carrier rails 13 toward a die pad aperture 17. Leads 10 may be stamped or etched from a sheet of lead frame material which is sufficiently ductile to allow the formation of lead ends 11 and lead fingers 12. Suitable lead frame materials include copper, iron, nickel, silver, gold, palladium, aluminum, or alloys, such as Alloy 42, containing these metals. Alloy 42 is a nickel/iron alloy comprising about 42% nickel and about 58% iron. Leads 10 may also be plated, selectively or by flood plating techniques, with highly conductive metals, such as silver or copper. Leads 10 are surrounded by separating strips 14 and carrier rails 13 having guide holes 15.

Carrier rails 13 and guide holes 15 are used to position lead frame material during the stamping or etching process and the plating processes. A stamping process involves making a lead frame base die or generic tool and mounting it on a high speed stamping apparatus. The stamping apparatus may then produce copies of a generic lead frame base pattern. As an alternative, lead frame base 1 may be produced by an etching process. Although initial setup costs for an etching process generally are lower than the initial tooling costs for a stamping process, an etching process involves the use and replenishment of etching materials and chemicals, such as photoresists. Further, etching processes currently do not produce lead flames as rapidly as a stamping process, and as production volume increases, stamped lead flames are more cost efficient than etched lead flames. Nevertheless, either process may be used with reel-to-reel or batch plating processes.

Leads 10 are arrayed on four sides of and define the size and shape of die pad aperture 17. Lead frame base 1 is configured for use with a quad IC device. However, leads 10 may be arrayed for use in dual-in-line and other IC device configurations. Aperture 17 also may be oversized to accommodate a plurality of chip sizes. An IC device manufacturer may compensate for the difference between the small size of a chip (not shown) and the relatively large size of aperture 17 by adjusting the length of the wire bonds (not shown) extending between a chip's bond pads (not shown) and lead fingers 12.

Figure 2A:
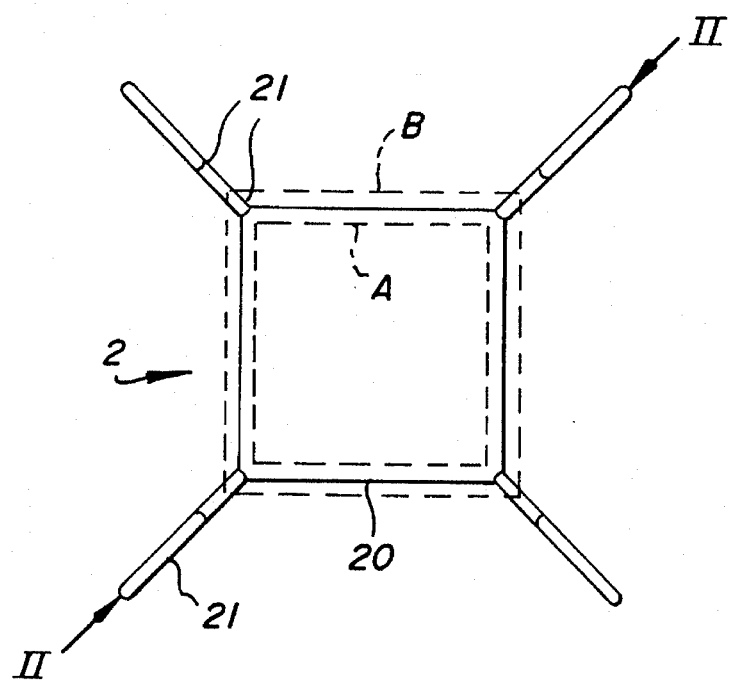
FIG. 2a depicts an overhead view of a die pad forming a mounting surface for a semiconductor chip A or B.

Referring to FIG. 2a, an overhead view of a die pad 2 is depicted. Die pad 2 forms a mounting surface 20 for a chip A or B. In this configuration, mounting surface 20 is substantially rectangular in shape and conforms to the shape of aperture 17 depicted in FIG. 1. In addition to mounting surface 20, die pad 2 includes four second tie bar portions 21 which extend from mounting surface 20. Die pad 2 is downset or offset to receive chip A, and each of the tie bar portions 21 may be bent at bend points 22. However, several alternative configurations of the tie bars for die pad attachment are possible.

Figure 2B:
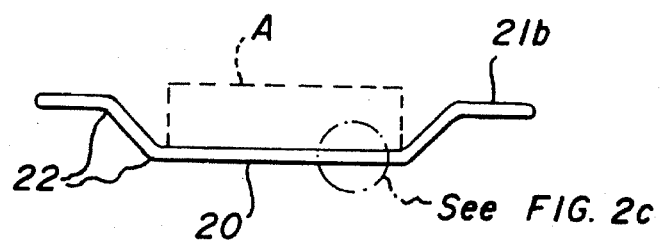
FIG. 2b depicts a cross-sectional view of the die pad of FIG. 2a, along line II—II, and having a chip A.

The location and angle of bend points 22 is determined by the size and height of chip A or B mounted on mounting surface 20. Generally, if the height of the chip increases, the angle of the bends may increase proportionately. Referring to FIG. 2b, a cross-sectional view of die pad 2 of FIG. 2a, along line II—II, and having chip A, is depicted. Bends 22 separate second tie bar portions 21 into segments 21a and 21b with segment 21b being substantially parallel to mounting surface 20. Die pad 2 may be downset, as depicted in FIG. 2b, by a stamping apparatus. A suitable stamping apparatus is adjustable to downset die pad 2 to accommodate chips of various heights. Further, die pad 2, as depicted in FIG. 2a, is downset to accommodate chip A which may be mounted on mounting surface 20. If larger chip B is mounted on mounting surface 20, bend points 22 may be placed farther from mounting surface 20 to accommodate larger chip B on die pad 2.

Figure 2C:
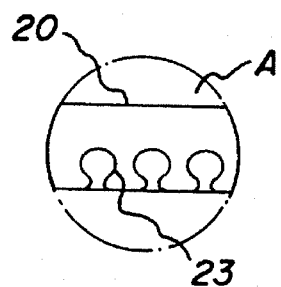
FIG. 2c depicts an enlarged cross-sectional view of a portion of the die pad of FIG. 2b revealing etching features on one side of the mounting surface.
Figure 3:
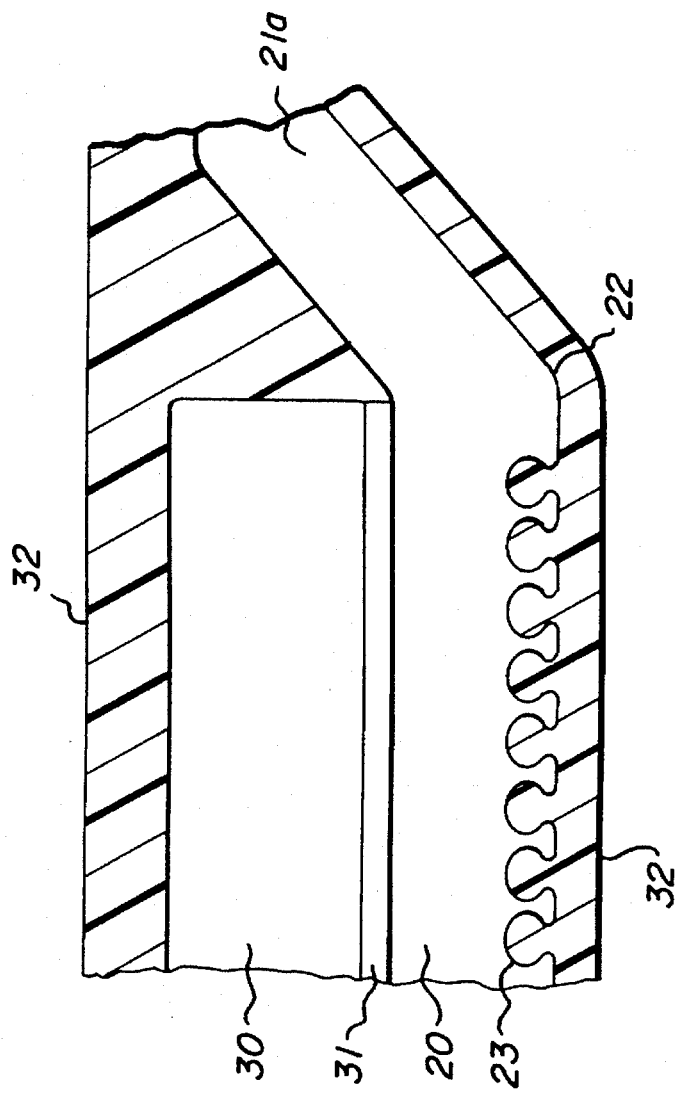
FIG. 3 depicts a partial cross-sectional view of the die pad of FIG. 2c, including a chip epoxied to the mounting surface and a plastic mold compound encapsulating the die pad and chip and filling the features.

As part of the packaging of IC devices, die pad 2 and chip A or B may be encapsulated in a plastic mold compound. FIG. 2c shows an enlarged cross-sectional view of a portion of mounting surface 20 of FIG. 2b. Mounting surface 20 includes etching features 23, such as a matrix of individual spherical or teardrop-shaped dimples, on the side of mounting surface 20 opposite chip A. Features 23 also may comprise a series of substantially parallel grooves. Referring to FIG. 3, a partial cross-sectional view of die pad 2 of FIG. 2c is depicted, which includes a chip 30 affixed to mounting surface 20 by a layer of epoxy adhesive 31. Die pad 2, chip 30, and layer of epoxy adhesive 31 are encapsulated in a plastic mold compound 32. Plastic mold compound 32 flows into and cures within etching features 23, thereby strengthening the bond between die pad 2 and plastic mold compound 32. This strengthened bond helps prevent delamination of plastic mold compound 32 from die pad 2 and lessens the danger of catastrophic adhesion failure, e.g., "popcorn failure." Popcorn failure may be caused by the vaporization of liquids, such as water, beneath plastic mold compound 32. The pressure build up due to the expanding vapor may cause plastic mold compound 32 to crack or fail.

Materials used to make die pad 2 may be similar to those used to make lead frame base 1. Nevertheless, die pad 2 also may be made from dielectric materials, which act as a heat sink; clad metals, which better manage stresses internally; or ceramic composites. A dielectric material is a material which is an insulator or in which an electric field can be sustained with a minimum of power, such as a material other than the condensed state of a metal. A clad metal is a metal overlaid on one or both sides with a different metal. A ceramic composite includes a material composed of a combination of ceramics with the addition of strengthening agents. Moreover, die pad 2 may be made of a combination of materials. For example, referring to FIG. 3, one side of die pad 2 may be matched to the thermal expansion coefficient of chip 30 and the other side is matched to the thermal expansion coefficient of plastic mold compound 32. From whatever material die pad 2 is made, a high integrity bond exists between die pad 2 and plastic mold compound 32. Further, whether die pad 2 is a heat dissipator or a heat sink depends upon the specific design of the IC device.

Figure 5:
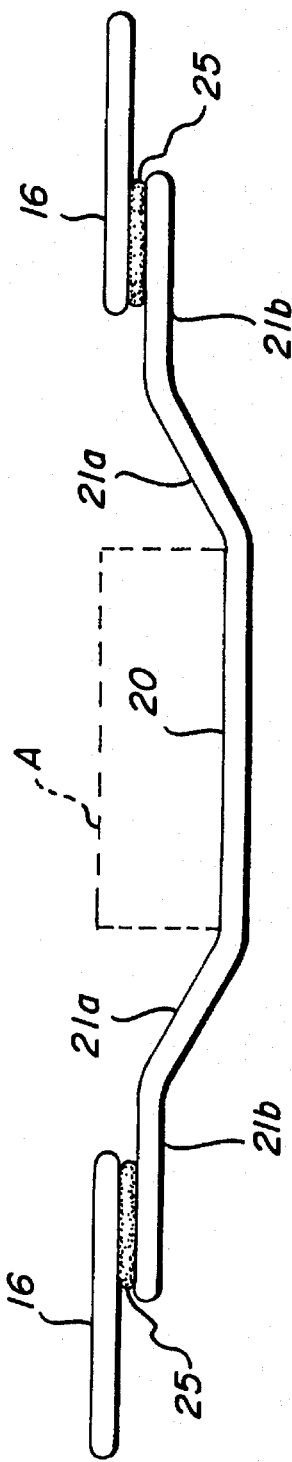
FIG. 5 depicts a cross-sectional view of the lead frame structure of FIG. 4, along line V—V, which shows the die pad of FIG. 2a downset to receive chip A and affixed by means of adhesive tape to the lead frame base of FIG. 1.
Figure 4:
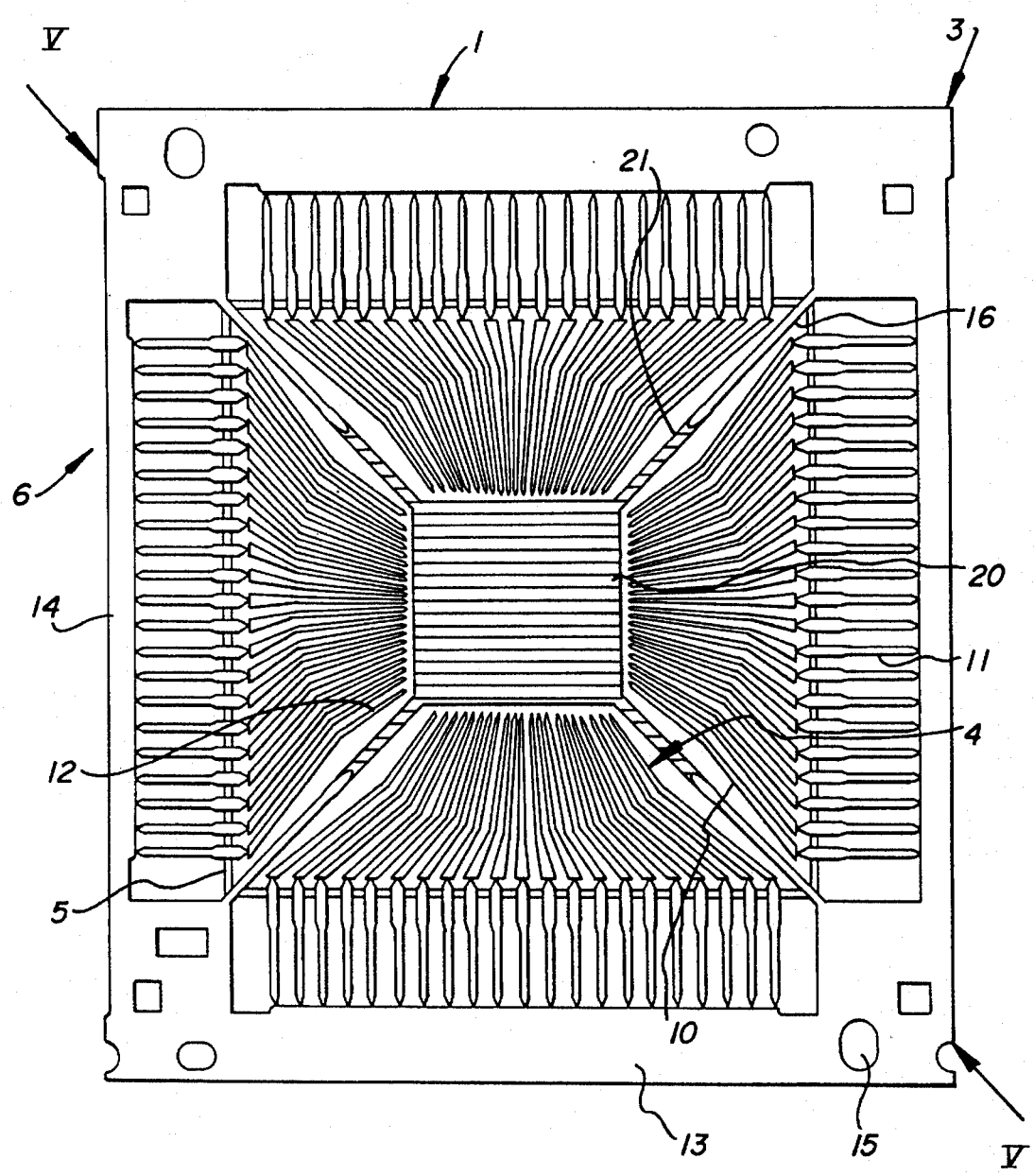
FIG. 4 depicts an overhead view of a lead frame structure, wherein the die pad of FIG. 2a, identified by hatching, is affixed to the lead frame base of FIG. 1.

Referring to FIG. 4, an overhead view of a lead frame structure 6 is depicted. Lead frame structure 6 includes lead frame base 1 of FIG. 1 affixed to die pad 2 of FIG. 2a, identified by hatching. Specifically, first tie bar portions 16 of lead frame base 1 are affixed to second tie bar portions 21 to form lead frame structure 6. FIG. 5 depicts lead frame structure 6 of FIG. 4, along line V—V, and shows tie bar portions 16 and 21, i.e., segment 21b, affixed to each other by means of adhesive tape 25. Adhesive tape 25 is a low ionic tape to minimize contamination during manufacturing of the IC device, and a suitable tape is Tomoegawa R722 produced by the Tomoegawa Company. Alternatively, tie bar portions 16 and 21 may be affixed to each other by adhesive bonding, such as with an acrylic adhesive; by welding; by soldering; by mechanical staking; or the like.

Figure 6:
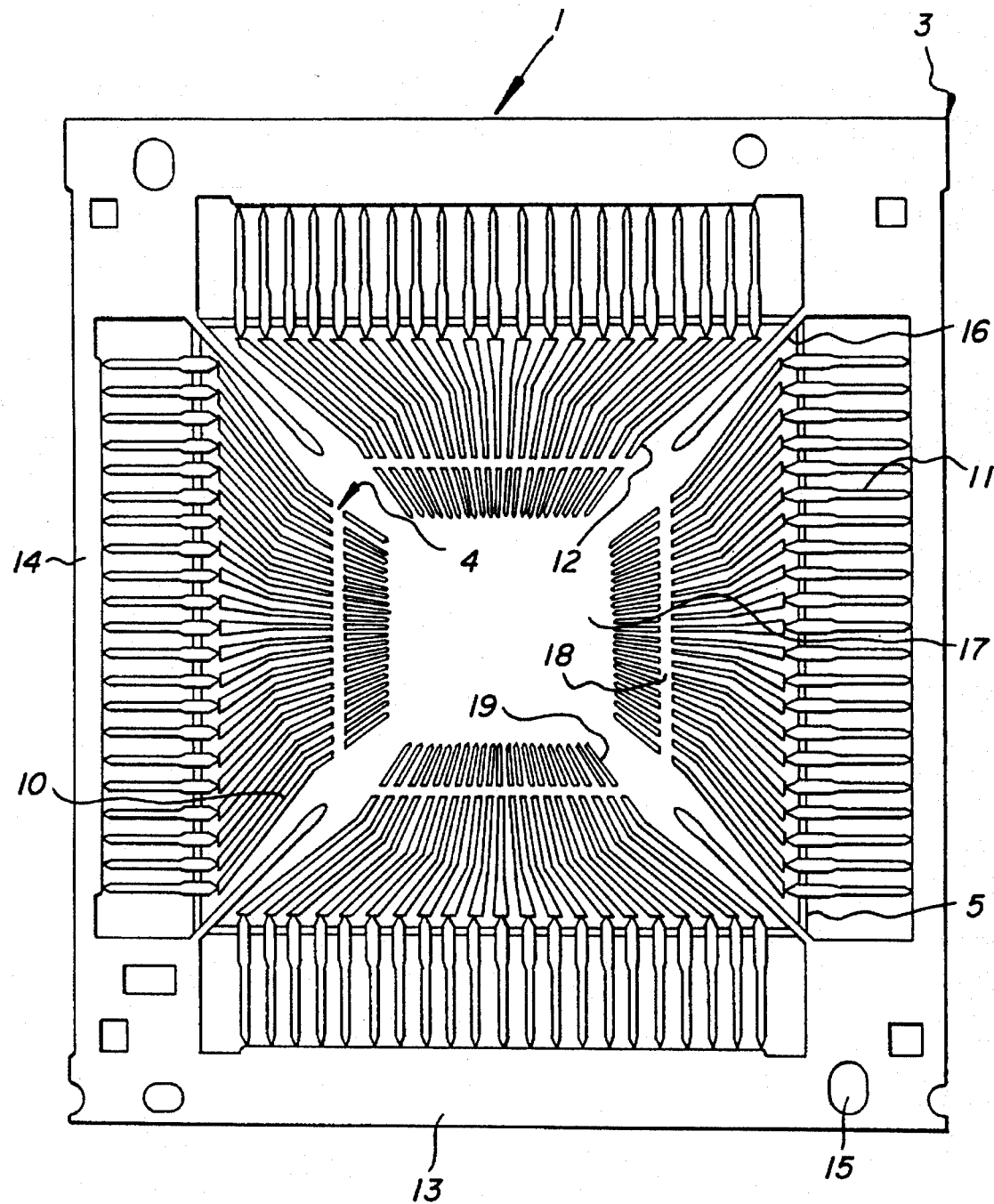
FIG. 6 depicts an overhead view of lead frame base with the lead finger tips severed to enlarge the die pad aperture.

Referring to FIG. 6, an overhead view of lead frame base 1 is depicted. A plurality of cuts 18 are made, e.g., by means of a blade or blades or a die, to sever lead finger tips 19. The purpose of cuts 18 is to shorten the length of leads 10 and thereby, to enlarge die pad aperture 17. As depicted in FIG. 2a, chip B may be larger than mounting surface 20 of die pad 2. Consequently, if aperture 17 is initially sized to accommodate mounting surface 20, chip B may also be larger than aperture 17. By severing lead finger tips 19, aperture 17 may be enlarged to accommodate chip B. Thus, a generic lead frame base may be combined with a generic die pad to manufacture a variety of IC devices having chips of various sizes. Further, because not all leads need be used in every IC device, the pin count or pitch of the IC device may be limited by the total number of leads of the generic lead frame base.

Although a detailed description of the present invention has been provided above, it is to be understood that the scope of the invention is to be determined by the claims that follow.

What is claimed is:

1. A lead frame structure for manufacturing an IC device comprising:

an lead frame base including a plurality of leads, said lead frame base having a die pad aperture and at least one first tie bar portion extending toward said aperture, and a die pad forming a mounting surface for receiving at least one chip and including at least one second tie bar portion extending from said mounting surface and corresponding to said at least one first tie bar portion, whereby said die pad is affixed to said lead frame base and positioned in said aperture by affixing said at least one second tie bar portion to overlap said corresponding at least one first tie bar portion.

2. The lead frame structure of claim 1, wherein said leads are arrayed along at least two sides of said aperture.

3. The lead frame structure of claim 1, wherein said leads are formed by a process selected from the group consisting of stamping and etching.

4. The lead frame structure of claim 1, wherein said die pad is formed by a process selected from the group consisting of stamping and etching.

5. The lead frame structure of claim 1, wherein said at least one second tie bar portion is affixed to said corresponding at least one first tie bar portion by a process selected from the group consisting of adhesive taping, adhesive bonding, welding, soldering, and mechanical staking.

6. The lead frame structure of claim 1, wherein said lead base frame has four first tie bar portions which correspond to four second tie bar portions extending from said mounting surface.

7. The lead frame structure of claim 1, wherein the size of said aperture is determined by the length of said leads, whereby the size of said aperture is enlarged as the length of said leads is shortened.

8. The lead frame structure of claim 1, wherein said die pad and said at least one chip are encapsulated in an encapsulating material and said die pad and said encapsulating material have thermal expansion coefficients which are about equal.

9. The lead frame structure of claim 1, wherein said die pad is made from a material selected from the group consisting of dielectric materials, clad metals, and ceramic composites.

10. The lead frame structure of claim 1, wherein said die pad and said at least one chip have thermal expansion coefficients which are about equal.

11. The lead frame structure of claim 1, wherein said die pad is encapsulated in an encapsulating material and said mounting surface is etched to improve bonding with said encapsulating material.

12. An IC device comprising the lead frame structure of claim 1 having an inner lead frame and at least one chip mounted on said mounting surface wherein said inner lead frame and said at least one chip are encapsulated in an encapsulating material.

* * * * *